(12) United States Patent
Goldberg et al.

(10) Patent No.: US 8,153,993 B2
(45) Date of Patent: *Apr. 10, 2012

(54) FRONT PLATE FOR AN ION SOURCE

(75) Inventors: Richard D. Goldberg, Cambridge, MA (US); Christopher Burgess, East Sussex (GB)

(73) Assignee: Applied Materials, Inc., Santa Clara, CA (US)

( * ) Notice: Subject to any disclaimer, the term of this patent is extended or adjusted under 35 U.S.C. 154(b) by 136 days.

This patent is subject to a terminal disclaimer.

(21) Appl. No.: 12/697,884

(22) Filed: Feb. 1, 2010

(65) Prior Publication Data

US 2010/0288940 A1    Nov. 18, 2010

Related U.S. Application Data

(63) Continuation of application No. 11/790,682, filed on Apr. 26, 2007, now Pat. No. 7,655,924.

(51) Int. Cl.
*H01J 37/08* (2006.01)
*H01J 27/08* (2006.01)
*H01J 1/52* (2006.01)

(52) U.S. Cl. ............... 250/423 R; 250/427; 250/492.21; 315/111.81; 315/111.31

(58) Field of Classification Search ............ 250/423 R, 250/427, 492.21; 315/111.81, 111.31
See application file for complete search history.

(56) References Cited

U.S. PATENT DOCUMENTS

| 4,754,200 | A | 6/1988 | Plumb et al. |
| 5,026,997 | A | 6/1991 | Benveniste |
| 5,420,415 | A | 5/1995 | Trueira |
| 6,710,358 | B1 * | 3/2004 | Chen et al. ............... 250/492.21 |
| 6,777,882 | B2 * | 8/2004 | Goldberg et al. ......... 315/111.81 |
| 7,005,782 | B2 | 2/2006 | Kanarov et al. |
| 7,087,913 | B2 * | 8/2006 | Goldberg et al. ......... 250/492.21 |
| 7,655,924 | B2 * | 2/2010 | Goldberg et al. ......... 250/423 R |
| 2005/0016838 | A1 | 1/2005 | Murata et al. |

FOREIGN PATENT DOCUMENTS

| JP | 04329249 A | 11/1992 |
| JP | 05114366 A | 5/1993 |
| JP | 08250055 A | 9/1996 |
| JP | 11016507 A | 1/1999 |

OTHER PUBLICATIONS

International Search Report and Written Opinion of the International Searching Authority mailed Aug. 20, 2007 (PCT/GB2007/001541).
Patents Act 1977: Search Report under Section 17(5) dated Aug. 26, 2006 (GB0608528.6).

* cited by examiner

*Primary Examiner* — Nikita Wells
(74) *Attorney, Agent, or Firm* — Patterson & Sheridan, LLP

(57) ABSTRACT

The present invention relates to a front plate for an ion source that is suitable for an ion implanter. The front plate according to the invention comprises obverse and reverse sides, an exit aperture for allowing egress of ions from the ion source that extends substantially straight through the front plate between the obverse and reverse sides, and a slot penetrating through the front plate from obverse side to reverse side at a slant for at least part of its depth, the slot extending from a side of the front plate to join the exit aperture. The slot is slanted to occlude line of sight into the ion source when viewed from in front, yet provides an expansion gap.

16 Claims, 5 Drawing Sheets

FRONT PLATE FOR AN ION SOURCE

CROSS-REFERENCE TO RELATED APPLICATIONS

This application is a continuation application of co-pending U.S. patent application Ser. No. 11/790,682, filed Apr. 26, 2007, which application claims benefit to United Kingdom Patent Application Serial No. 0608528.6 filed on Apr. 28, 2006, of which both applications are herein incorporated by reference.

FIELD OF THE INVENTION

The present invention relates to a front plate for an ion source that is suitable for an ion implanter.

BACKGROUND OF THE INVENTION

A contemplated application of the present invention is in ion sources in an ion implanter that may be used in the manufacture of semiconductor devices or other materials, although many other applications are possible. In such an application, semiconductor wafers are modified by implanting atoms of-desired dopant species into the body of the wafer to form regions of varying conductivity. Examples of common dopants are boron, phosphorus, arsenic and antimony. These dopants are generated in an ion source.

Typically, an ion implanter contains an ion source held under vacuum within a vacuum chamber. The ion source produces ions using a plasma generated within an arc chamber. The plasma in the arc chamber is struck using potential differences and a source of thermal electrons. The thermal electrons may be generated using one of a number of different arrangements such as a Freeman source or a Bernas source (including indirectly heated cathodes).

In a typical Bernas source, thermal electrons are emitted from a cathode, accelerated under the influence of an electric field and are constrained by a magnetic field to travel along spiral paths towards a counter-cathode. Interactions with precursor gas molecules within the arc chamber produces the desired plasma.

Plasma ions are extracted from the arc chamber via an aperture provided in a front plate. In an "ion shower" mode, the ions travel to implant in a target such as a semiconductor wafer. Alternatively, the extracted ions may be passed through a mass analysis stage such that ions of a desired mass and energy are selected to travel onward to implant in a semiconductor wafer. A more detailed description of an ion implanter can be found in U.S. Pat. No. 4,754,200.

The ion source will comprise the arc chamber to contain the plasma. Chamber walls and a front plate like that shown in FIGS. 1 and 2 enclose the arc chamber. This two-piece construction assembles to form a slot-like aperture to allow ions to be extracted from the arc chamber. Tongue and groove arrangements, shown at A, are provided to facilitate alignment of the two parts of the front plate. An extraction electrode assembly is generally provided in front of the aperture to extract ions from the ion source, and the front plate may form one of the electrodes of that assembly.

SUMMARY OF THE INVENTION

Against this background, the present invention resides in a front plate for an ion source comprising an exit aperture for allowing egress of ions from the ion source that extends substantially straight through the front plate between the obverse and reverse sides, and a slot penetrating through the front plate from obverse side to reverse side at a slant for at least part of its depth, the slot extending from a side of the front plate to join the exit aperture.

The provision of the slanted slot allows expansion of the front plate to be accommodated thereby relieving thermal stress. This is beneficial because the front plate of ion sources may become hot. For example, where the front plate is used with an arc chamber, the heat in the plasma will be transferred to some extent to the front plate and this will expand as a result. As the front plate is typically made from a metal, temperature rises are quick and expansion is pronounced. Graphite is also commonly used for the front plate.

The exit aperture allows direct line of sight into the ion source such that ions may be extracted freely from the ion source for subsequent implantation where the present invention is used in an ion implanter. The slanted slot does not present line of sight into the ion source. In addition, the use of a slanted slot increases the path length through the front plate. As a result, the tendency for ions and gas to escape from the ion source through the slot is much reduced. In particular, the provision of a slanted slot effectively prevents the penetration of electric fields into the ion source. These fields may be as a result of an electrode assembly used to extract ions from the ion source. The combination of a straight exit aperture and a slanted slot means that the extraction field penetrates into the ion source through the exit aperture but not through the slot.

Optionally, the slot may extend linearly from the side to the exit aperture. The exit aperture may also be linear and may, optionally, be substantially co-linear with the slot. Thus the straight exit aperture and the slanted slot may intersect at a point such that the parts of the front plate to either side of the slot and the exit aperture are not joined, and can move relative to each other as the front plate expands. In a preferred embodiment, the front plate is unitary. For example, the front plate may extend around the end of the exit aperture not joined to the slot so as to form a general C-shape or similar.

Fashioning the front plate from a single piece of material is advantageous as alignment of the front plate becomes straightforward compared with multi-piece designs. For instance, alignment of the extraction aperture edges becomes easy to control. Furthermore, the front plate may be precisely shaped and it is far easier to control this shape when machining a single piece of material. The precise shape will be very important where the front plate forms an electrode and so is used to shape carefully an electric field.

The slot may be formed at a constant slant through the front plate or it may be formed with a dog-leg as it extends through the front plate. One part of the dog-leg may extend straight through the front plate.

All combinations of the above features indicated as optional are also contemplated to form part of the invention.

According to further aspects, the present invention resides in an ion source comprising any of the front plate arrangements described above and in an ion implanter comprising any such ion source.

BRIEF DESCRIPTION OF THE DRAWINGS

In order that the present invention may be better understood, a preferred embodiment will now be described with reference to the accompanying drawings, in which.

DETAILED DESCRIPTION OF THE INVENTION

Figure 1:
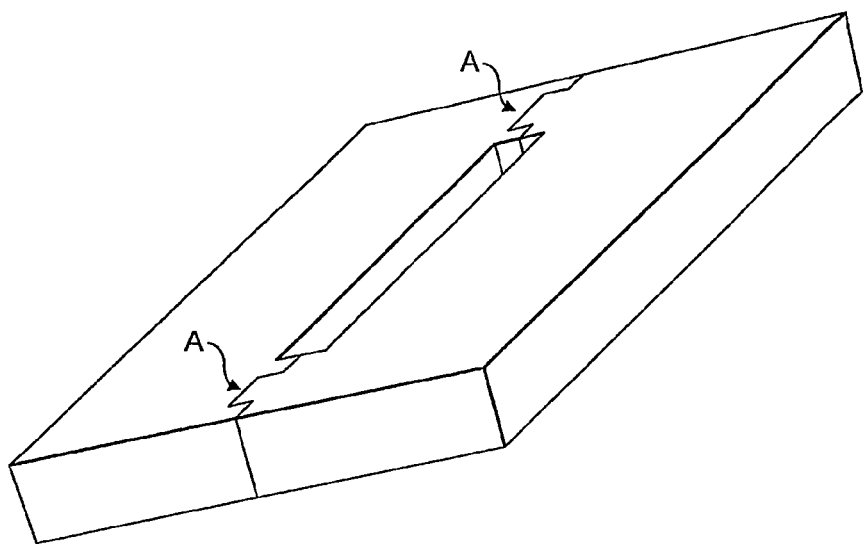
FIG. 1 is a perspective view of an assembled front plate according to the prior art.
Figure 2:
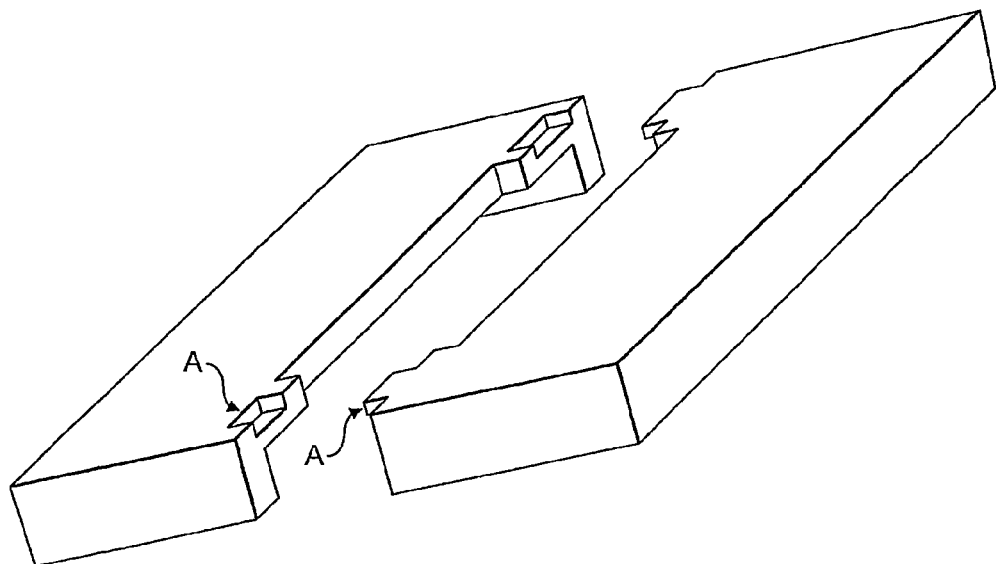
FIG. 2 is a perspective view of the front plate of FIG. 1 before assembly.
Figure 3:
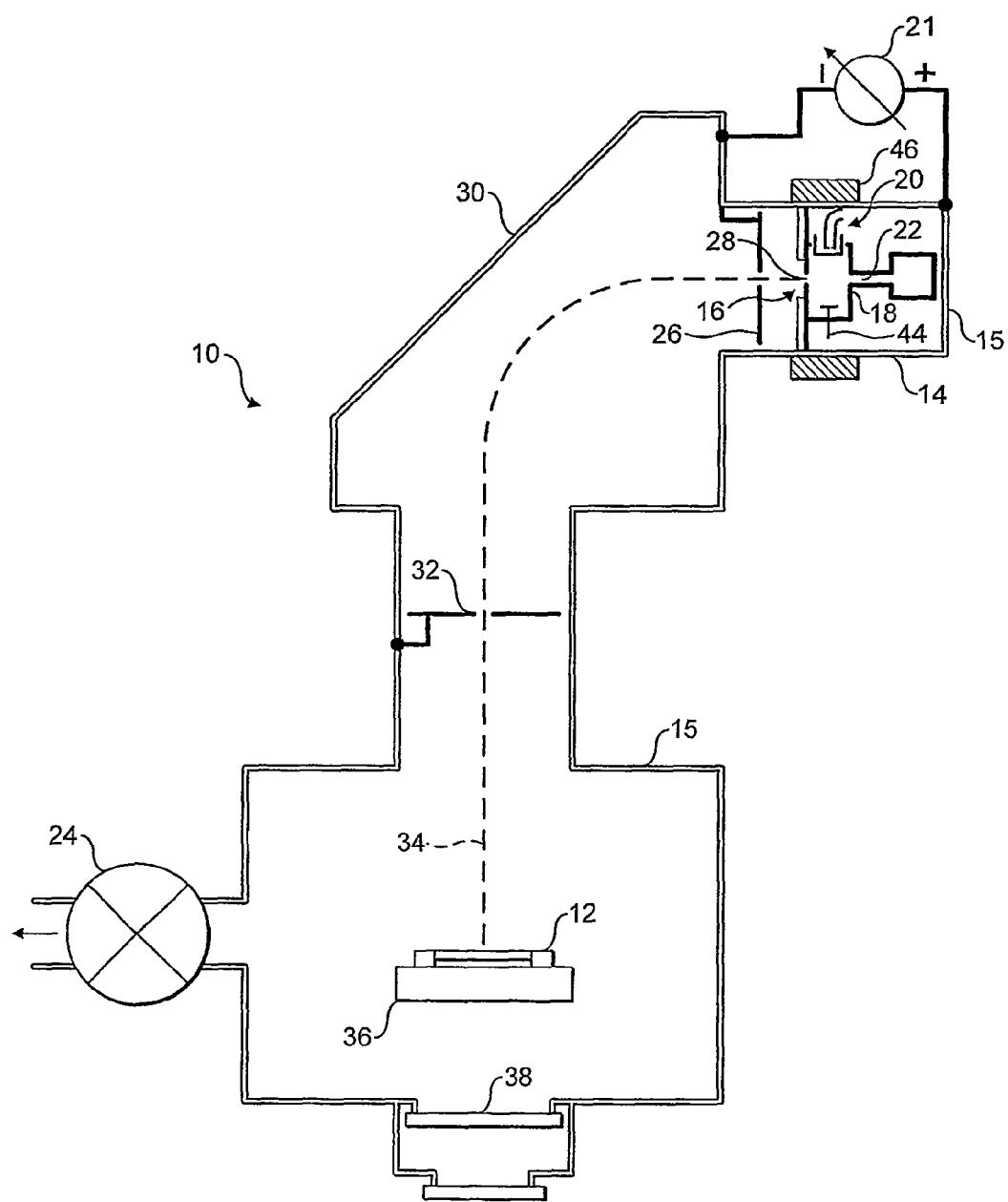
FIG. 3 is a schematic representation of an ion implanter.

In order to provide a context for the present invention, an exemplary application is shown in FIG. 3, although it will be appreciated that this is merely an example of an application of the present invention and is in no way limiting.

FIG. 3 shows a known ion implanter 10 for implanting ions in semiconductor wafers 12 including an ion source 14 and front plate 28 according to the present invention. Ions are generated by the ion source 14 to be extracted and passed, in this embodiment, through a mass analysis stage 30. Ions of a desired mass are selected to pass through a mass-resolving slit 32 and then to strike a semiconductor wafer 12.

The ion implanter 10 contains an ion source 14 for generating an ion beam of a desired species that is located within a vacuum chamber 15. The ion source 14 generally comprises an arc chamber 16 containing a cathode 20 located at one end thereof. The ion source 14 may be operated such that an anode is provided by the walls 18 of the arc chamber 16. The cathode 20 is heated sufficiently to generate thermal electrons.

Thermal electrons emitted by the cathode 20 are attracted to the anode, the adjacent chamber walls 18 in this case. The thermal electrons ionise gas molecules as they traverse the arc chamber 16, thereby forming a plasma and generating the desired ions.

The path followed by the thermal electrons may be controlled to prevent the electrons merely following the shortest path to the chamber walls 18. A magnet assembly 46 provides a magnetic field extending through the arc chamber 16 such that thermal electrons follow a spiral path along the length of the arc chamber 16 towards a counter-cathode 44 located at the opposite end of the arc chamber 16.

A gas feed 22 fills the arc chamber 16 with the species to be implanted or with a precursor gas species. The arc chamber 16 is held at a reduced pressure within the vacuum chamber 15. The thermal electrons travelling through the arc chamber 16 ionise the gas molecules present in the arc chamber 16 and may also crack molecules. The ions created in the plasma will also contain trace amounts of contaminant ions (e.g. generated from the material of the chamber walls).

Ions from within the arc chamber 16 are extracted through an exit aperture 28 provided in a front plate 28 of the arc chamber 16 using a negatively-biased (relative to ground) extraction electrode 26. A potential difference is applied between the ion source 14 and the following mass analysis stage 30 by a power supply 21 to accelerate extracted ions, the ion source 14 and mass analysis stage 30 being electrically isolated from each other by an insulator (not shown). The mixture of extracted ions are then passed through the mass analysis stage 30 so that they pass around a curved path under the influence of a magnetic field. The radius of curvature travelled by any ion is determined by its mass, charge state and energy and the magnetic field is controlled so that, for a set beam energy, only those ions with a desired mass to charge ratio and energy exit along a path coincident with the mass-resolving slit 32. The emergent ion beam is then transported to the target, i.e. the substrate wafer 12 to be implanted or a beam stop 38 when there is no wafer 12 in the target position. In other modes, the beam may also be accelerated or decelerated using a lens assembly positioned between the mass analysis stage 30 and the target position.

The semiconductor wafer 12 will be mounted on a wafer holder 36, wafers 12 being successively transferred to and from the wafer holder 36 for serial implantation. Alternatively, parallel processing may be used where many wafers 12 are positioned on a carousel 36 that rotates to present the wafers 12 to the incident ion beam in turn.

Figure 4:
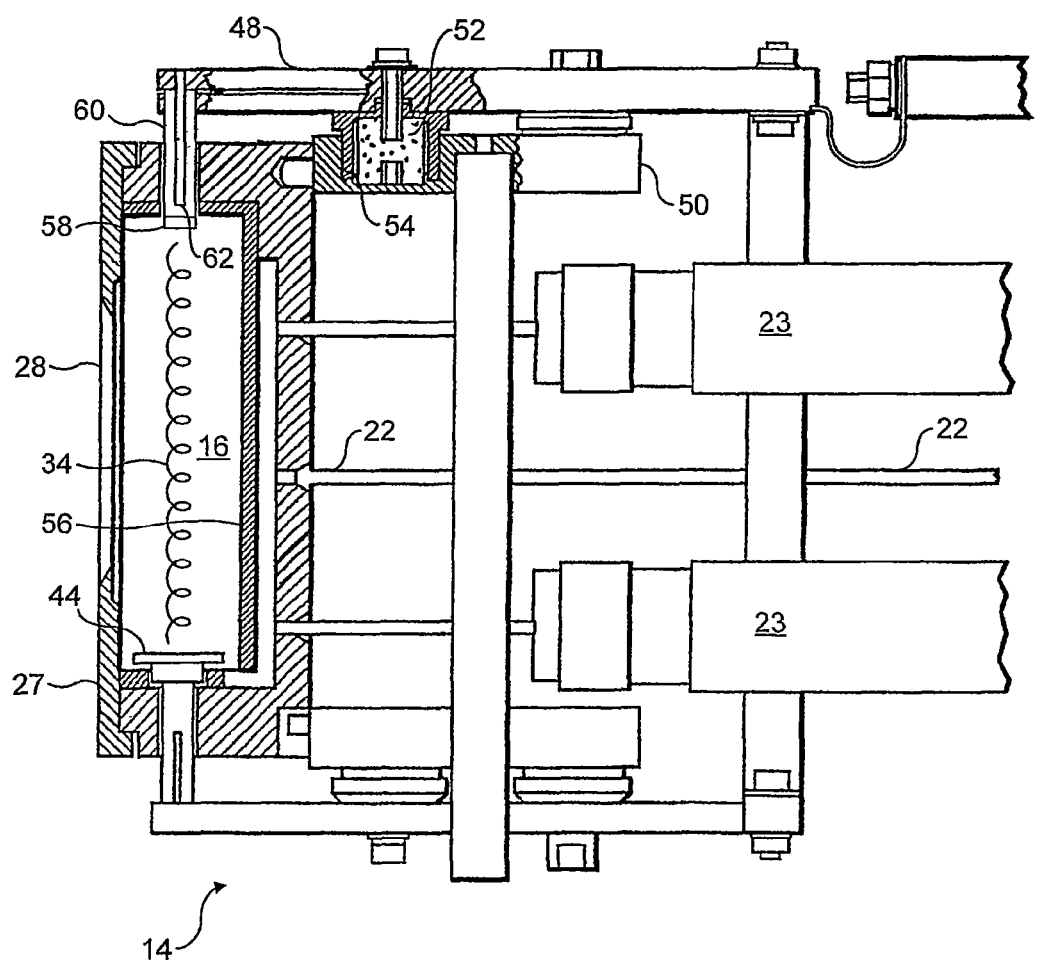
FIG. 4 is a side view of the ion source of FIG. 3.
Figure 8:
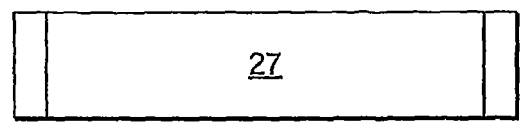
FIG. 8 is a side view from line VIII-VIII of FIG. 5.
Figure 5:
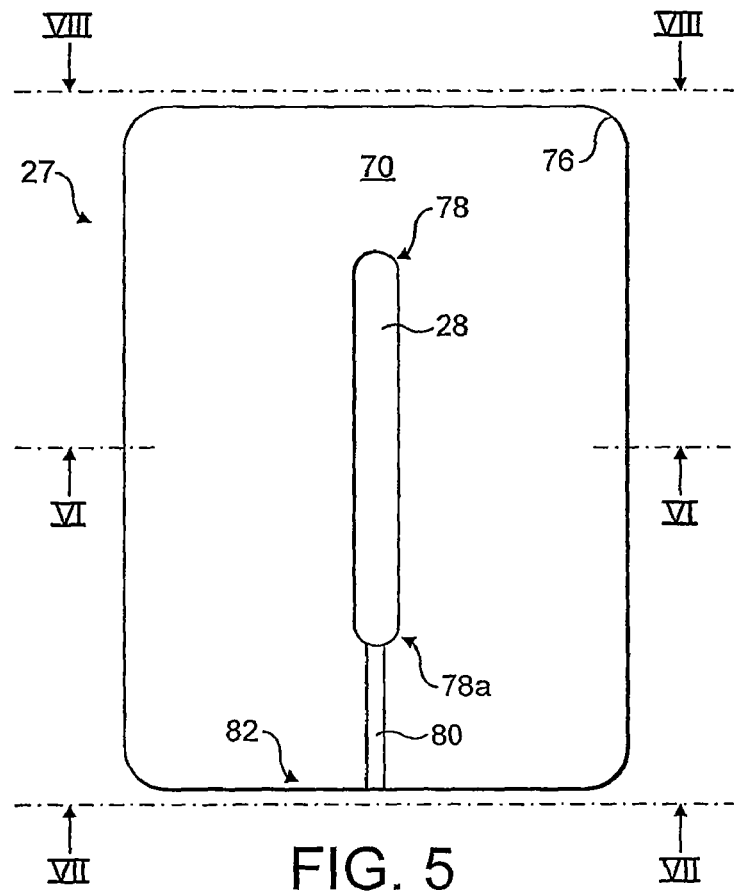
FIG. 5 is a front view of the front plate of FIG. 4.
Figure 6:
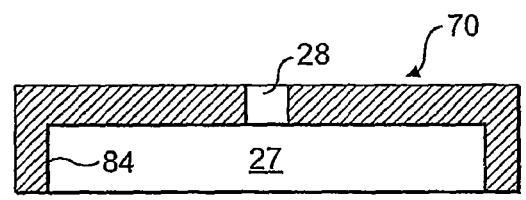
FIG. 6 is a sectional view along line VI-VI of FIG. 5.
Figure 7:
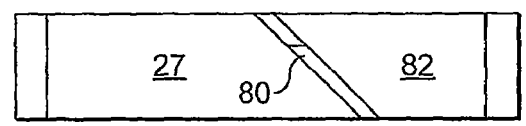
FIG. 7 is a side view from line VII-VII of FIG. 5.
Figure 9:
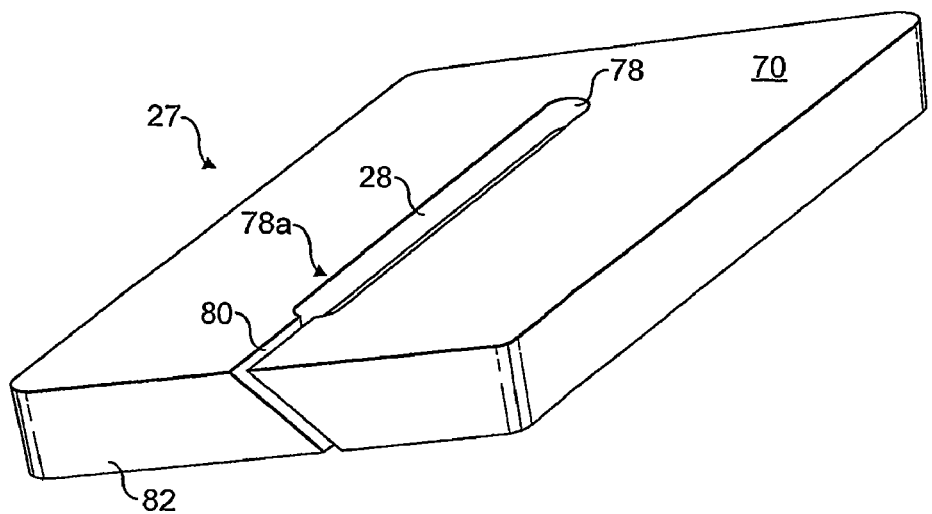
FIG. 9 is a perspective view from in front of the front plate of FIG. 5.
Figure 10:
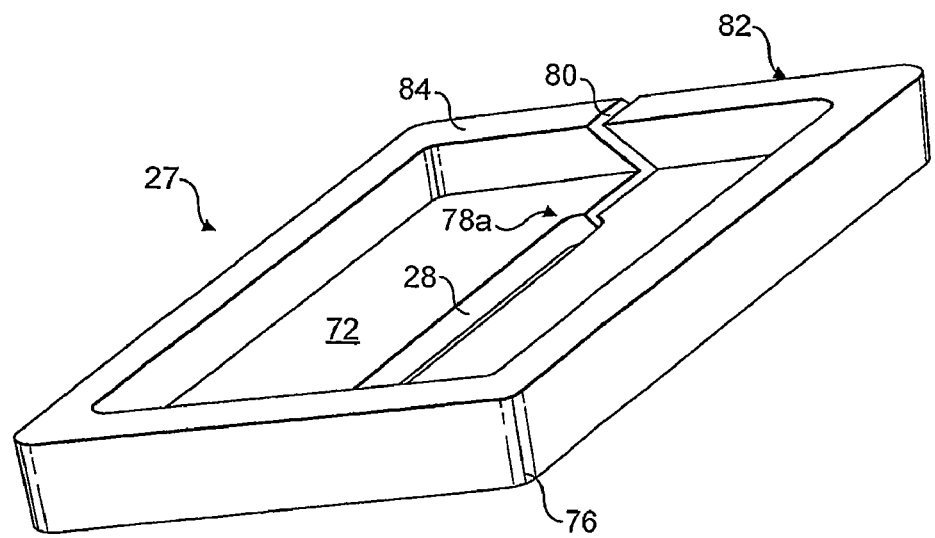
FIG. 10 is a perspective view from behind the front plate of FIG. 5.

FIG. 4 shows in greater detail the ion source 14 used in the ion implanter 10 of FIG. 3. FIG. 4 corresponds to an indirectly-heated cathode arrangement, although other arrangements such as a filament or Freeman-type may be used.

In FIG. 4, a cathode is provided by an end cap 58 of a tube 60 that projects slightly into the arc chamber 16, the tube 60 containing a heating filament 62. The heating filament 62 and end cap 58 are kept at different potentials to ensure thermal electrons emitted by the filament 62 are accelerated into the end cap 58, and a gap is left between the tube 60 and the liner 56 of the arc chamber 16 to maintain electrical isolation. Acceleration of electrons into the end cap 58 transfers energy to the end cap 58 such that it heats up sufficiently to emit thermal electrons into the arc chamber 16. A counter-cathode 44 is located at the far end of the arc chamber 16, again with a small separation from the liner 56 to ensure electrical isolation. A magnet assembly 46 (shown only in FIG. 3) is operable to provide a magnetic field that causes electrons emitted from the end cap 58 to follow a spiral path 34 along the length of the arc chamber 16 towards the counter-cathode 44. The arc chamber 16 is filled with the precursor gas species by a gas feed 22 or by one or more vaporisers 23 that may heat a solid or liquid.

The heating filament 62 is held in place by two clamps 48 that are each connected to the body 50 of the ion source 14 using an insulating block 52. The insulating block 52 is fitted with a shield 54 to prevent any gas molecules escaping from the arc chamber 16 from reaching the insulating block 52.

The arc chamber 16 is formed by walls of which the back, sides, top and bottom are provided with the liner 56. The front of the arc chamber 16 is formed by the front plate 27 that seals the arc chamber 16 with the exception of the exit aperture 28 through which ions are extracted and a slit 28 to be described.

FIGS. 5 to 10 show a front plate 27 according to an embodiment of the present invention. The front plate 27 is machined from a single piece of material to have a front face 70 and a back face 72. The front plate 27 will be made from a high-melting point material that is electrically conducting. Graphite would be a good choice, as would metals. The front face 70 of the front plate 27 (as viewed when fitted to an ion source) is rectangular with rounded corners 76. An elongate slot 28 with rounded ends 78 is provided centrally therein to serve as the exit aperture 28. A narrower slit 80 extends from one end 78a of the slot 28 to the adjacent side 82 of the front plate 27.

The back face 72 of the front plate 27 has an upstanding flange 84 that abuts against the sides of the arc chamber 16. The exit aperture 28 sits within the area enclosed by the flange 84, whereas the slit 80 extends to meet and then to break through the flange 84. As can be seen, the exit aperture 28 extends at right angles from the front face 70 of the front plate 27 whereas the slit 80 is angled. Thus, the exit aperture 28 provides direct line of sight into the ion source 14 when viewed from in front whereas the slit 80 does not. As a result of this angle and longer path lengths, ion loss and gas loss from the arc chamber 16 through the slit 80 is minimized.

As will be appreciated by the person skilled in the art, variations may be made to the above embodiment without departing from the scope of the invention defined by the claims.

For example, the overall shape of the front plate 27 may be varied from the rectangular form shown. In addition, the corners 76 need not be rounded. An elongate exit aperture 28 is not essential and other shapes may be adopted. The exit aperture 28 and slit 80 need not be co-linear. In fact, neither the exit aperture 28 nor the slit 80 need be linear and other shapes may be used. Although a slit 80 is shown that adopts a constant slant, the slant may vary as the slit 80 extends through the front plate 28 and/or the slit 80 may be kinked, to form a dog-leg for example.

While an arc chamber 16 is described in a preferred ion source 14, the present invention also extends to other ion sources 14. For example, the benefit of the present invention will be enjoyed by any ion source 14 that gets hot as a result of the ionisation process.

What is claimed is:

1. A front plate for an ion source comprising:
   an obverse side and a reverse side;
   an exit aperture for allowing egress of ions from the ion source that extends substantially straight through the front plate between the obverse side and reverse side; and
   a slot penetrating through the front plate from obverse side to reverse side at a slant for at least part of its depth, the slot extending from a side of the front plate to join the exit aperture with the exit aperture adapted to provide direct line of sight with an ion source and the slot prevents line of sight with an ion source from the obverse side and reverse side.

2. The front plate of claim 1, wherein the slot extends linearly from the side to the exit aperture.

3. The front plate of claim 1, wherein the exit aperture is linear.

4. The front plate of claim 1, wherein the slot and exit aperture are substantially co-linear.

5. The front plate of claim 1, wherein the slot is formed at a constant slant through the front plate.

6. The front plate of claim 1, wherein the slot forms a dog-leg as it extends through the front plate.

7. The front plate of claim 1, wherein the front plate comprises a single piece.

8. The front plate of claim 1, wherein the reverse side includes a peripheral flange.

9. An ion source comprising:
   an arc chamber comprising walls and containing a cathode located at one end thereof;
   a counter-electrode disposed at an opposite end of the arc chamber;
   an extraction electrode disposed adjacent the arc chamber; and
   a front plate coupled to the arc chamber, between the cathode and the extraction electrode, wherein the front plate comprises:
   an obverse side and a reverse side;
   an exit aperture for allowing egress of ions from the ion source that extends substantially straight through the front plate between the obverse side and reverse side; and
   a slot penetrating through the front plate from obverse side to reverse side at a slant for at least part of its depth, the slot extending from a side of the front plate to join the exit aperture with the exit aperture adapted to provide direct line of sight with an ion source and the slot prevents line of sight with an ion source from the obverse side and reverse side.

10. The front plate of claim 9, wherein the slot extends linearly from the side to the exit aperture.

11. The front plate of claim 9, wherein the exit aperture is linear.

12. The front plate of claim 9, wherein the slot and exit aperture are substantially co-linear.

13. The front plate of claim 9, wherein the slot is formed at a constant slant through the front plate.

14. The front plate of claim 9, wherein the slot forms a dog-leg as it extends through the front plate.

15. The front plate of claim 9, wherein the front plate comprises a single piece.

16. The front plate of claim 9, wherein the reverse side includes a peripheral flange.

* * * * *

UNITED STATES PATENT AND TRADEMARK OFFICE
CERTIFICATE OF CORRECTION

| | | |
|---|---|---|
| PATENT NO. | : 8,153,993 B2 | Page 1 of 1 |
| APPLICATION NO. | : 12/697884 | |
| DATED | : April 10, 2012 | |
| INVENTOR(S) | : Goldberg et al. | |

It is certified that error appears in the above-identified patent and that said Letters Patent is hereby corrected as shown below:

Title Page:

Please insert

--(30) Foreign Application Priority Data

Apr. 28, 2006 (GB)........0608528.6--.

Signed and Sealed this
Twenty-fourth Day of July, 2012

David J. Kappos
*Director of the United States Patent and Trademark Office*